US005387762A

United States Patent [19]
Hasegawa et al.

[11] Patent Number: 5,387,762
[45] Date of Patent: Feb. 7, 1995

[54] RESIN-PACKAGED ELECTRONIC COMPONENT HAVING BENT LEAD TERMINALS

[75] Inventors: Miki Hasegawa; Yasuo Kanetake, both of Kyoto, Japan

[73] Assignee: Rohm Co., Ltd., Kyoto, Japan

[21] Appl. No.: 170,785

[22] Filed: Dec. 21, 1993

[30] Foreign Application Priority Data

Dec. 28, 1992 [JP] Japan .................................. 4-349205

[51] Int. Cl.$^6$ ............................................. H01L 23/02
[52] U.S. Cl. .................................... 174/52.4; 29/838; 361/743
[58] Field of Search .............. 174/52.4, 52.3, 52.1, 174/52.2; 29/825, 827, 835, 838, 841; 361/772, 774, 760, 743

[56] References Cited

U.S. PATENT DOCUMENTS

| | | | |
|---|---|---|---|
| 4,076,955 | 2/1978 | Gates, Jr. ............................ | 174/52.4 |
| 4,252,390 | 2/1981 | Bowling .............................. | 439/73 |
| 4,340,901 | 7/1982 | Anazawa et al. ................... | 257/693 |
| 4,467,260 | 10/1990 | Butt ................................... | 257/668 |
| 4,665,954 | 5/1987 | Linker et al. ...................... | 140/147 |
| 4,807,087 | 2/1989 | Sawaya ............................... | 361/773 |
| 4,827,611 | 5/1989 | Pai et al. ............................ | 29/843 |
| 4,996,587 | 2/1991 | Hinrichsmeyer et al. ........... | 257/676 |
| 5,041,901 | 8/1991 | Kitano et al. ...................... | 257/779 |
| 5,107,324 | 4/1992 | Iwahara et al. .................... | 257/696 |
| 5,273,081 | 12/1993 | Maksim .............................. | 140/105 |

FOREIGN PATENT DOCUMENTS 1-230218 9/1989 Japan .

Primary Examiner—Leo P. Picard
Assistant Examiner—Christopher Horgan
Attorney, Agent, or Firm—William H. Eilberg

[57] ABSTRACT

An electronic component is provided which comprises a resin package for enclosing inside parts, and at least one lead terminal projecting out from the resin package to have a bonding end. The lead terminal is bent to provide an armpit-like portion between the lead terminal and the resin package for retaining a solder wire in a sandwiched state. At the time of mounting the electronic component to a circuit board, the solder wire be caused to melt at a soldering temperature for merging with solder fillets along the bonding end of the lead terminal.

6 Claims, 5 Drawing Sheets

RESIN-PACKAGED ELECTRONIC COMPONENT HAVING BENT LEAD TERMINALS

BACKGROUND OF THE INVENTION

1. Field of the Invention

This invention relates to an electronic component of the type which comprises a resin package for enclosing inside parts, and at least one lead terminals projecting out from the package and bent at its root point. The present invention also relates to a method of bending the lead terminal. The present invention further relates to a method of mounting such an electronic component.

2. Description of the Prior Art

It is known to enclose various electronic elements, such as semiconductor chips, in a resin package for protection. In such an electronic component, each lead terminal is led out of the package and suitably bent for mounting onto a circuit board by soldering.

FIGS. 10 and 11 of the accompanying drawings show a typical prior art resin-packaged electronic component. Specifically, the component comprises a protective resin package 1' and a pair of lead terminals 2' projecting out of the package 1'.

Each of the lead terminals 2' is bent downward at the root point which is a position immediately adjacent to the package 1', as indicated by arrows A' in FIG. 12. The lead terminal is further bent at an intermediate portion inwardly toward the package (as indicated by solid lines in FIG. 10) or outwardly away from the package (as indicated by phantom lines in FIG. 10) to provide a bonding end which is used for mounting the electronic component to e.g. a circuit board by soldering.

The prior art electronic component of FIGS. 10-12 is advantageous in that the overall length L' of the component can be rendered relatively small because each of the lead terminals 2' is bent downward at the root point by utilizing a relatively sharp edge portion of the resin package 1'. Indeed, the lateral projecting amount S' of the lead terminal corresponds substantially to the thickness of the lead terminal itself in case the bonding end of the lead terminal is bent inwardly toward the package thereunder.

However, the utilization of the relatively sharp edge of the resin package 1' as a bending support results in concentration of bending stress at the root point of each lead terminal 2'. Thus, the lead terminal is liable to crack formation and may have a reduced strength at the bending root point. Further, since a bending force is directly applied to the package, it may be damaged, by chipping for example, at the sharp edge portion.

In view of the above problems, Japanese Patent Application Laid-open No. 1-230218 discloses a resin-packaged capacitor wherein each of lead terminals is conveniently bent by using a backup wire.

More specifically, as shown in FIGS. 13 and 14 of the accompanying drawings, the capacitor disclosed in the above-mentioned Japanese patent document comprises a protective resin package 1" and a pair of lead terminals 2". Each of the lead terminals 2" is bent downwardly about a cylindrical backup wire 3" which is arranged at an armpit-like portion of the capacitor, as indicated by arrows A" in FIG. 13. The backup wire 3" is removed after completing the bending operation, as clearly shown in FIG. 14.

Apparently, the backup wire 3" supports a round support for conveniently bending the lead terminal 2" without undue stress concentration at the bending point of the lead terminal and without direct application of a bending force to the resin package 1". However, the prior art of FIGS. 13 and 14 still has the following problems.

First, the backup wire 3" need be made of a relatively hard material to prevent compressive deformation of the wire at the time of performing the bending operation since otherwise it will be difficult or impossible to remove the backup wire after the bending operation. Thus, each of the lead terminals 2" will laterally project at least by an amount S" which is equal to the sum of the diameter D" of the backup wire 3" and the thickness T" of the lead terminal 2", consequently increasing the overall length L" of the capacitor.

Secondly, the need for removing the backup wire 3" increases the time required for making the capacitor, hence an increase of the production cost.

In the third place, when mounting the capacitor to a printed circuit board by soldering, there is a tendency that, due to insufficiency of used solder paste, the solder fillets which are formed at the connection between the lead terminals and the circuit board will not have a sufficient height as required for reliably bonding the capacitor. Thus, the bonding strength for the capacitor may become low. Indeed, this problem is also encountered in mounting any electronic component to a printed circuit board.

SUMMARY OF THE INVENTION

It is, therefore, an object of the present invention to provide a resin-packaged electronic component wherein each lead terminal can be conveniently bent without much increasing the size of the component.

Another object of the present invention is to provide a resin-packaged electronic component which can be relibaly mounted on a circuit board by soldering.

A further object of the present invention is to provide a method of conveniently bending each lead terminal in a resin-packaged electronic component.

Still another object of the present invention is to provide a method of reliably mounting a resin-packaged electronic component onto a circuit board by soldering.

According to one aspect of the present invention, there is provided an electronic component comprising: a resin package for enclosing inside parts; at least one lead terminal projecting out from the resin package, the lead terminal being bent to provide an armpit-like portion between the lead terminal and the resin package; and a solder wire sandwiched between the lead terminal and the resin package at the armpit-like portion.

With the arrangement described above, the solder wire provides a round support about which the lead terminal can be conveniently bent without causing un undue stress concentration at the bending point and without damaging the resin package. Normally, due to the soft nature of solder, the solder wire is compressively deformed, so that the overall size of the electronic component can be reduced at by an amount corresponding to the compressive deformation of the solder wire.

Prior to bending, the solder wire may be attached to the lead terminal by adhesive bonding or by soldering. Further, the lead terminal may have a bonding end bent inwardly toward the resin package. Alternatively, the lead terminal may have a bonding end bent outwardly away from the resin package.

For mounting the electronic component to a workpiece such as a circuit board, the solder wire may be caused to melt at a soldering temperature for merging with solder fillets along the bonding end of the lead terminal. As a result, the height of the solder fillets will become sufficient for reliably retaining the component on the circuit board.

According another aspect of the present invention, there is provided a lead terminal bending method for an electronic component which comprises a resin package for enclosing inside parts, and at least one lead terminal projecting out from the resin package. The lead terminal bending method comprises the steps of: arranging a solder wire at an armpit-like portion between the lead terminal and the resin package; and bending the lead terminal about the solder wire to sandwich the solder wire between the lead terminal and the resin package at the armpit-like portion.

Other objects, features and advantages of the present invention will be fully understood from the following detailed description given with reference to the accompanying drawings.

DETAILED DESCRIPTION OF THE PREFERRED EMBODIMENTS

Figure 1:
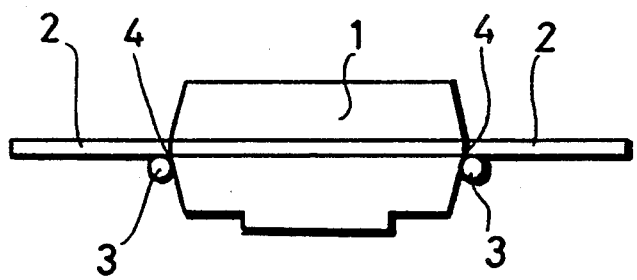
FIG. 1 is a front view showing a resin-packaged electronic component according to the present invention before bending lead terminals.
Figure 2:
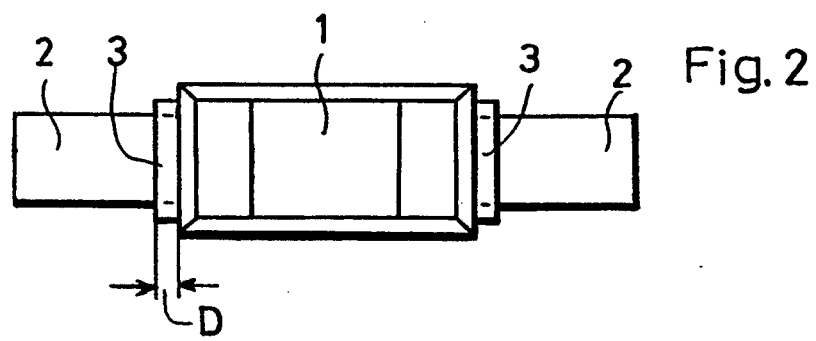
FIG. 2 is a bottom view showing the same component.

Referring to FIGS. 1 and 2 of the accompanying drawings, there is shown a resin-packaged electronic component embodying the present invention. The illustrated component comprises a resin package 1 enclosing or sealing a semiconductor chip (not shown) together with other related parts (also not shown). The components further comprises a pair of lead terminals 2 projecting straight from the package 1 in an intial state.

For subsequently bending the lead terminals 2 in a convenient manner, the resin package 1 is closely flanked by a pair of cylindrical solder wires 3 immediately under the respective lead terminals 2. Each of the solder wires 3 is held in contact with both the package 1 and the corresponding lead terminal 2 at each armpit-like portion of the component. The solder wire may be held in place by adhesive bonding or soldering, as indicated at 4. The solder wire has an initial diameter D, as shown in FIG. 2.

Figure 3:
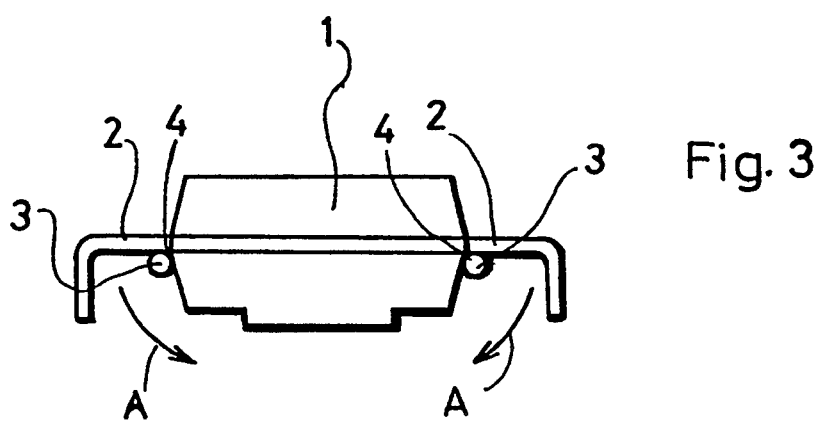
FIGS. 3 and 4 are front views showing the successive step of bending the lead terminals of the same component.
Figure 4:
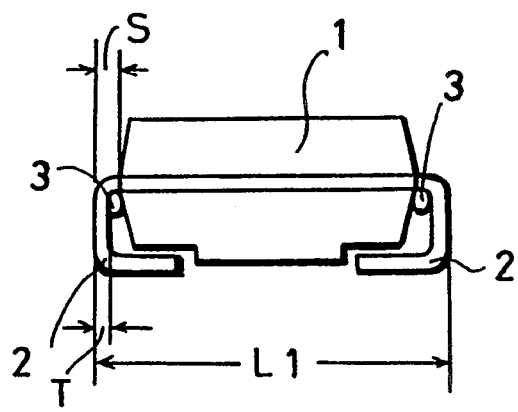

As shown in FIG. 3, the lead terminals 2 are first bent downwardly at their respective intermediate portions to provide respective bonding ends. Then, the lead terminals 2 are further bent downwardly about the respective solder wires 3, as indicated by arrows A in FIG. 3. As a result, the bonding ends of the respective lead terminals 2 are located under the resin package 1 with the solder wires 3 fixed compressively at the armpit-like portions of the thus bent lead terminals 2, as shown in FIG. 4.

According to the above bending operation, the solder wires 3 provide round bending supports at the respective armpit-like portions of the lead terminals 2. Thus, it is possible to avoid stress concentration at the bending points of the lead terminals 2, thereby preventing crack formation which might be caused by a stress concentration. Further, the solder wires 3 prevent a bending force from being directly applied the resin package 1, so that the package can be prevented from being damaged at the time of bending the lead terminals 2.

Due to the relatively soft nature of the solder wires 3 as the bending supports, they will be compressively deformed after the bending operation. Thus, each of the lead terminals 2 can be made to project laterally only by an amount S (FIG. 4) which is smaller than the sum of the thickness T of the lead terminal and the initial diameter D (FIG. 2) of the corresponding solder wire 3, consequently making smaller the overall length L1 of the electronic component than if the solder wires 3 are not compressively deformed.

Figure 5:
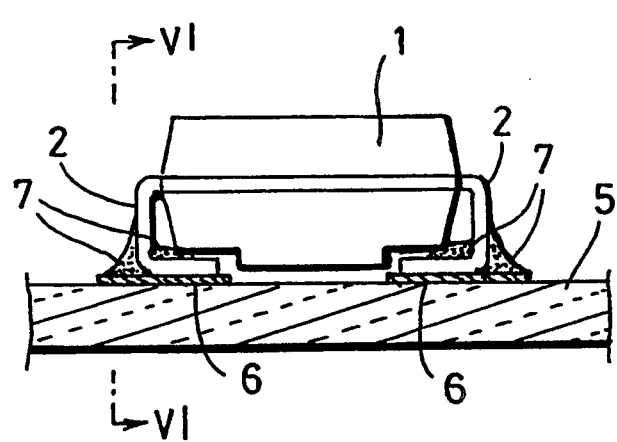
FIG. 5 is a front view, partly in section, showing the same component as mounted to a circuit board.
Figure 6:
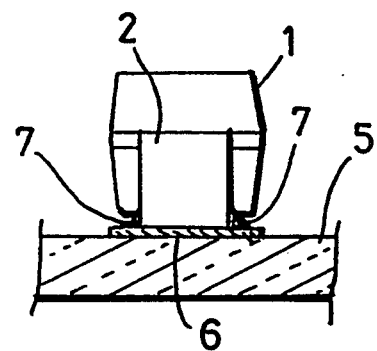
FIG. 6 is a side view, partly in section, as seen in the direction of arrows VI—VI in FIG. 5.

As shown in FIGS. 5 and 6, the electronic component described above may be mounted on a printed circuit board 5 which carries bonding pads 6 in a circuit conductor pattern (not shown) together with other circuit elements (not shown). Specifically, the respective bonding ends of the bent lead terminals 2 are fixedly connected to the bonding pads 6 by soldering. At this time, the solder wires 3 previously held at the armpit-like portions of the component are melted at the soldering temperature to move downwardly toward the circuit board 5 for merging with solder fillets 7 along the edges of the respective bonding ends of the lead terminals 2. As a result, the solder fillets 7 can grow to a degree required for providing an enough bonding strength.

Figure 7:
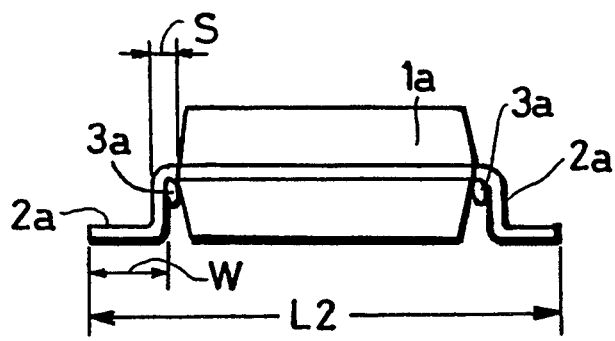
FIG. 7 is a front view showing another resin-packaged electronic component according to the present invention after bending lead terminals but before mounting.

FIG. 7 shows another resin-packaged electronic component embodying the present invention. Similarly, to the foregoing embodiment, the component of this embodiment comprises a resin package 1a enclosing or sealing a semiconductor chip (not shown) together with other related parts (also not shown), and a pair of lead terminals 2a projecting out from the package 1a.

At an armpit-like portion, each of the lead terminals 2a is bent downward about a solder wire 3a which is compressively deformed at the time of bending. Further, the lead terminal 2a is bent again at an intermediate portion away from the resin package 1a to have a bonding end which extends horizontally outward.

For a given overall length L2 of the electronic component, each of the lead terminals 2a can be made to have an increased bonding length W due to a reduction of the projecting amount S of the lead terminal from the resin package 1a, thereby providing an increased bonding area. Further, due to the provision of the solder wires 3a, the electronic component of this embodiment enjoys substantially the same advantagesuages as already described in connection with the foregoing embodiment.

Figure 8:
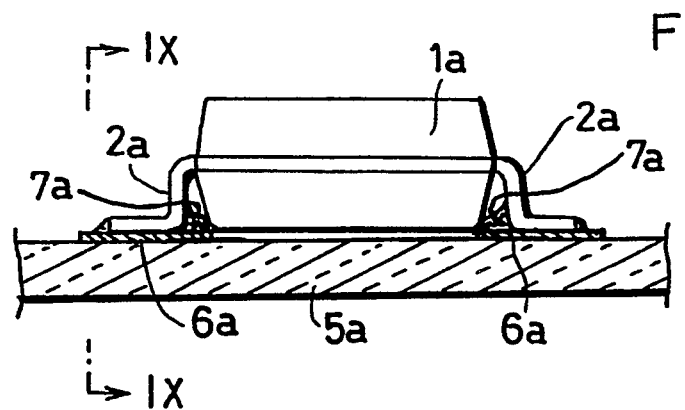
FIG. 8 is a front view, partly in section, showing the component of FIG. 7 as mounted on a circuit board.
Figure 9:
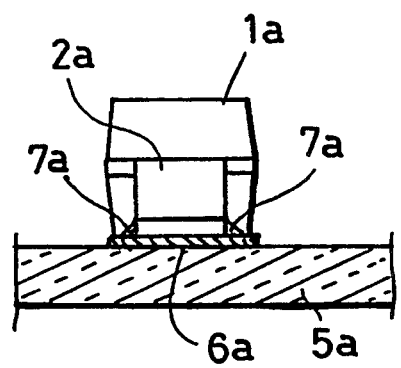
FIG. 9 is a side view, partly in section, as seen in the direction of arrows IX—IX in FIG. 8.
Figure 10:
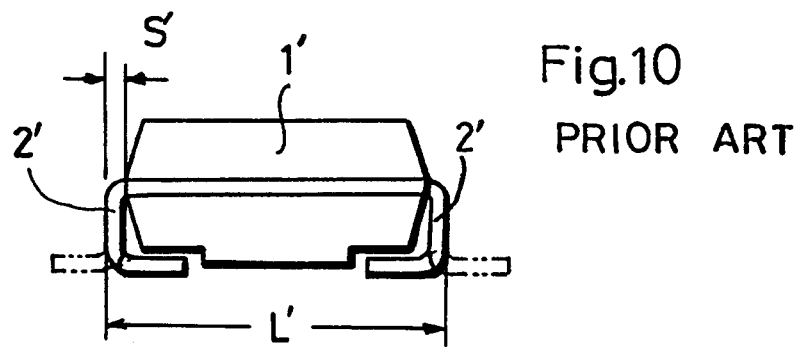
FIG. 10 is a prior art resin-packaged electronic component.
Figure 11:
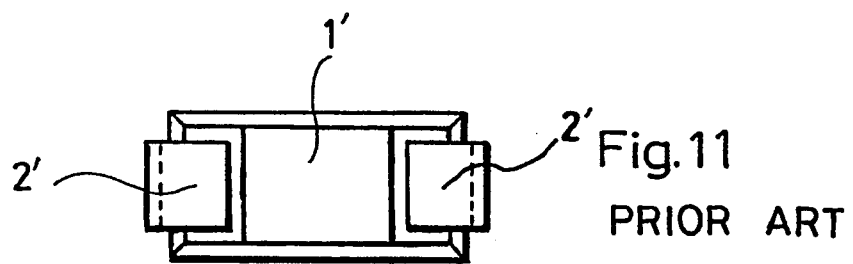
FIG. 11 is a bottom view of the same prior art component.
Figure 12:
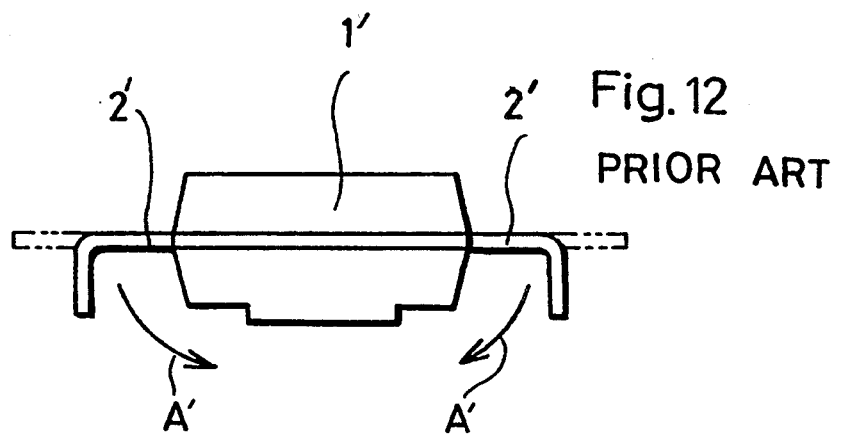
FIG. 12 is a front view showing the steps of bending lead terminals with respect to the prior art component of FIG. 10.
Figure 13:
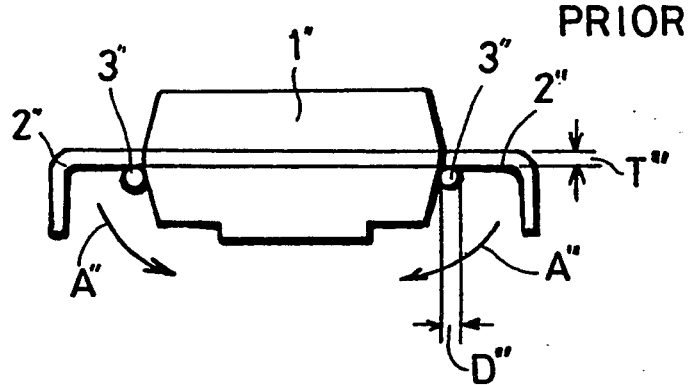
FIG. 13 is a front view showing another prior art resin-packaged electronic component at the time of bending lead terminals.
Figure 14:
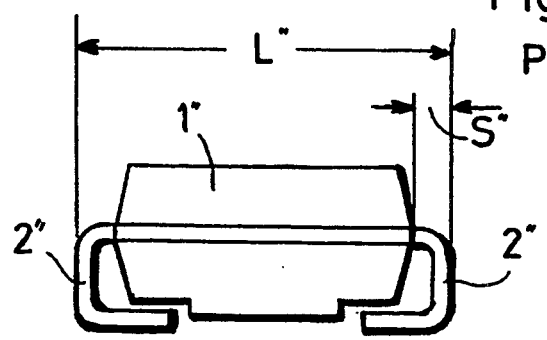
FIG. 14 is a front view showing the same prior art component after bending the lead terminals.

As shown in FIGS. 8 and 9, the electronic component of FIG. 7 may be mounted, by soldering, onto a printed circuit board 5a carrying bonding pads 6a in a circuit conductor pattern (not shown) together with other circuit elements (not shown). At the time of soldering, the solder wires 3a previously held at the armpit-like portions of the component are melted at the soldering temperature to move downwardly toward the circuit board 5a for merging with solder fillets 7a along the edges of the respective bonding ends of the lead terminals 2a.

The present invention being thus described, it is obvious that the same may be varied in many ways. For instance, the present invention may be applied to any electronic component which has at least one lead terminal projecting out from a resin package. Such variations are not to be regarded as a departure from the spirit and scope of the present invention, and all such modifications as would be obvious to those skilled in the art are intended to be included within the scope of the following claims.

We claim:

1. In an electronic component which comprises a resin package for enclosing inside parts, and at least one lead terminal projecting out from the resin package; a method of bending the lead terminal comprising the steps of:

arranging a solder wire at an armpit-like portion between the lead terminal and the resin package; and bending the lead terminal about the solder wire to sandwich the solder wire between the lead terminal and the resin package at the armpit-like portion.

2. The method according to claim 1, wherein the solder wire is made to compressively deform at the time of bending.

3. The method according to claim 1, wherein the solder wire is attached to the lead terminal by adhesive before bending the lead terminal.

4. The method according to claim 1, wherein the solder wire is attached to the lead terminal by soldering before bending the lead terminal.

5. The method according to claim 2, wherein the lead terminal is further bent to have a bonding end directed inwardly toward the resin package.

6. The method according to claim 2, wherein the lead terminal is further bent to have a bonding end directed outwardly away from the resin package.

* * * * *